(12) United States Patent
Lin et al.

(10) Patent No.: US 9,873,943 B2
(45) Date of Patent: Jan. 23, 2018

(54) APPARATUS AND METHOD FOR SPATIAL ATOMIC LAYER DEPOSITION

(71) Applicant: Taiwan Semiconductor Manufacturing Co., Ltd., Hsin-Chu (TW)

(72) Inventors: Anthony Lin, Hsin-Chu (TW); Ching-Lun Lai, Taichung (TW); Pei-Ren Jeng, Hsinchu County (TW); Tze-Liang Lee, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/169,999

(22) Filed: Jun. 1, 2016

(65) Prior Publication Data

US 2017/0167021 A1    Jun. 15, 2017

Related U.S. Application Data

(60) Provisional application No. 62/267,793, filed on Dec. 15, 2015.

(51) Int. Cl.
| | | |
|---|---|---|
| C23C 16/455 | (2006.01) | |
| C23C 16/44 | (2006.01) | |
| H01L 21/02 | (2006.01) | |
| C23C 16/458 | (2006.01) | |

(52) U.S. Cl.
CPC .... *C23C 16/45551* (2013.01); *C23C 16/4412* (2013.01); *C23C 16/4584* (2013.01); *C23C 16/45519* (2013.01); *C23C 16/45578* (2013.01); *H01L 21/0228* (2013.01)

(58) Field of Classification Search
CPC ........ C23C 16/45551; C23C 16/45578; C23C 16/45519; C23C 16/4412; H01L 21/0228
See application file for complete search history.

(56) References Cited

U.S. PATENT DOCUMENTS

| | | |
|---|---|---|
| 4,058,430 A | 11/1977 | Suntole et al. |
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |

(Continued)

FOREIGN PATENT DOCUMENTS

| | | |
|---|---|---|
| TW | 201423885 A | 6/2014 |
| TW | 201520363 A | 6/2015 |

*Primary Examiner* — Kyoung Lee
(74) *Attorney, Agent, or Firm* — Haynes and Boone, LLP

(57) ABSTRACT

The present disclosure provides a semiconductor fabrication apparatus in accordance with one embodiment. The apparatus includes a processing chamber; a wafer stage configured in the processing chamber, the wafer stage is operable to secure and rotate a plurality of wafers around an axis; a first chemical delivery mechanism configured in the processing chamber to provide a first chemical to a first reaction zone in the processing chamber; and a second chemical delivery mechanism configured in the processing chamber to provide a second chemical to a second reaction zone in the processing chamber. The second chemical delivery mechanism includes an edge chemical injector and a first radial chemical injector.

20 Claims, 11 Drawing Sheets

(56) References Cited

U.S. PATENT DOCUMENTS

| | | |
|---|---|---|
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2013/0092185 A1 | 4/2013 | Matsui et al. |
| 2014/0001574 A1 | 1/2014 | Chen et al. |
| 2014/0110755 A1 | 4/2014 | Colinge |
| 2014/0127404 A1 | 5/2014 | Yudovsky et al. |
| 2014/0151812 A1 | 6/2014 | Liaw |
| 2015/0147889 A1* | 5/2015 | Yudovsky ........... H01L 21/0228 438/758 |
| 2015/0176124 A1 | 6/2015 | Greer et al. |

* cited by examiner

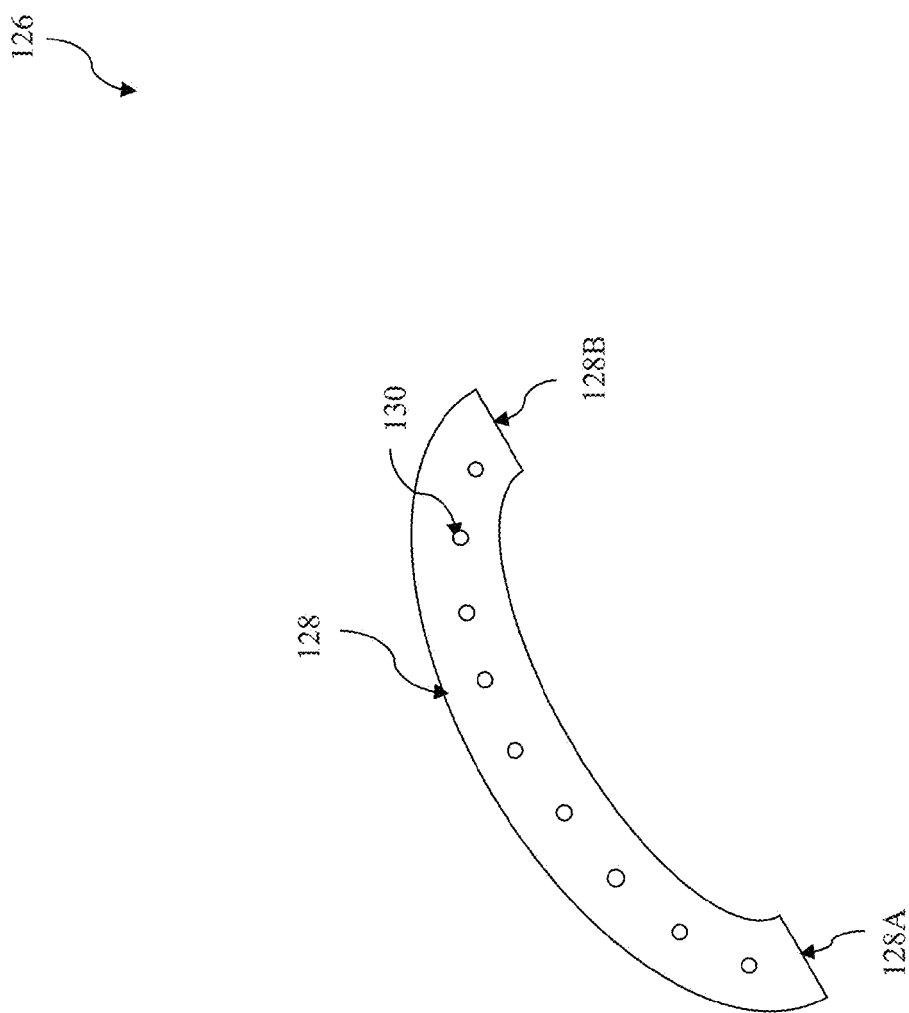

APPARATUS AND METHOD FOR SPATIAL ATOMIC LAYER DEPOSITION

CROSS-REFERENCE TO RELATED APPLICATIONS

This application claims priority to U.S. Provisional Patent Application Ser. No. 62/267,793, filed on Dec. 15, 2015, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, an atomic layer deposition process is utilized to from a thin film. The atomic layer deposition technique deposits a thin film with a controlled deposition but has disadvantages of low deposition rate and decreased fabrication throughput. A spatial atomic layer deposition is proposed to deposition a thin film with a controlled deposition and improved deposition rate. However, available spatial atomic deposition has other issues, such as degraded film uniformity and degraded film quality. Accordingly, it would be desirable to provide a spatial atomic layer deposition and a method of utilizing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussions.

FIG. 5B is a schematic view of a chemical injector of the SALD module in FIG. 1, constructed in accordance with some embodiments.

DETAILED DESCRIPTION

Figure 1:
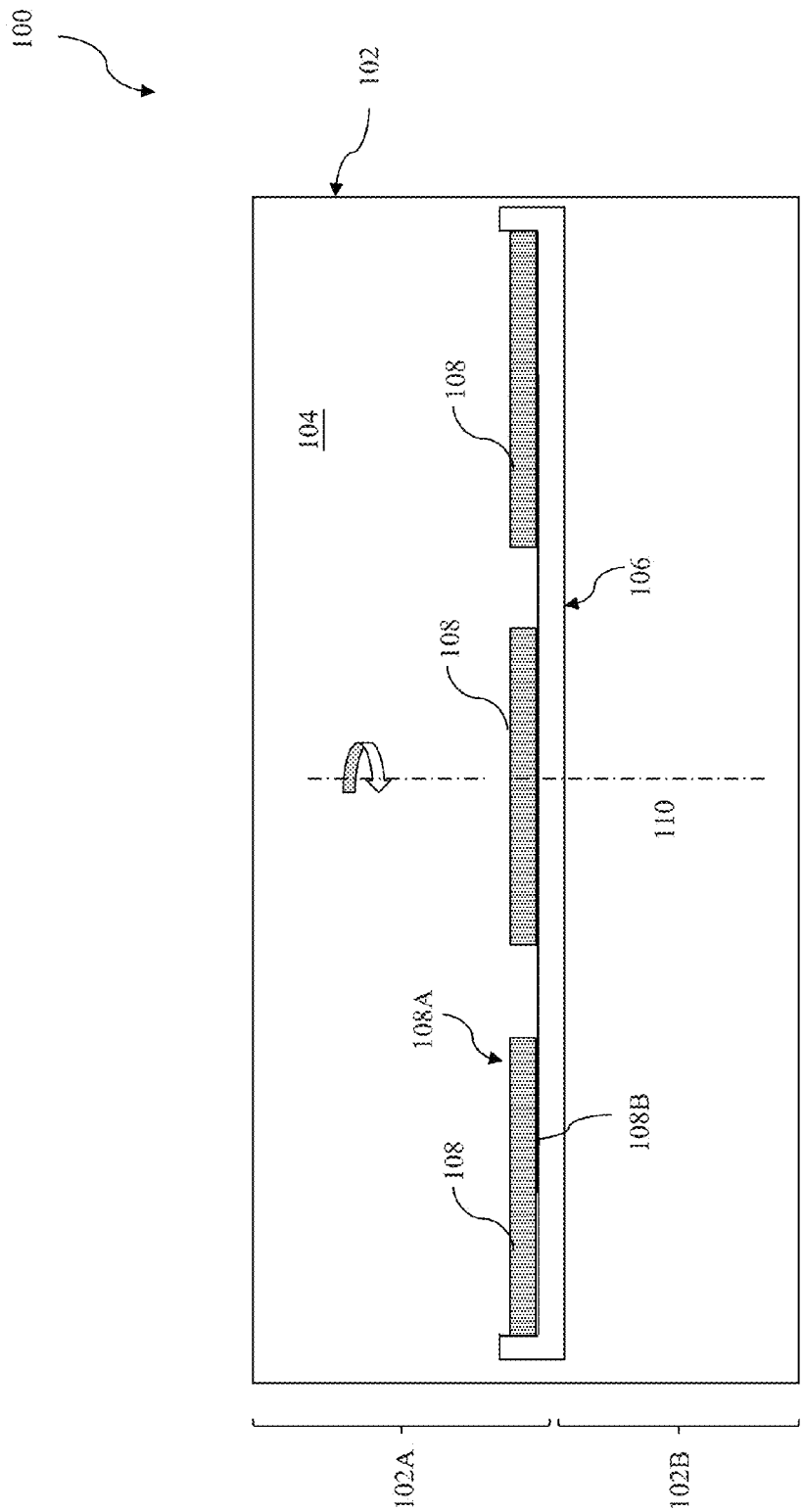
FIG. 1 is a schematic and sectional view of a spatial atomic layer deposition (SALD) module constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 2:
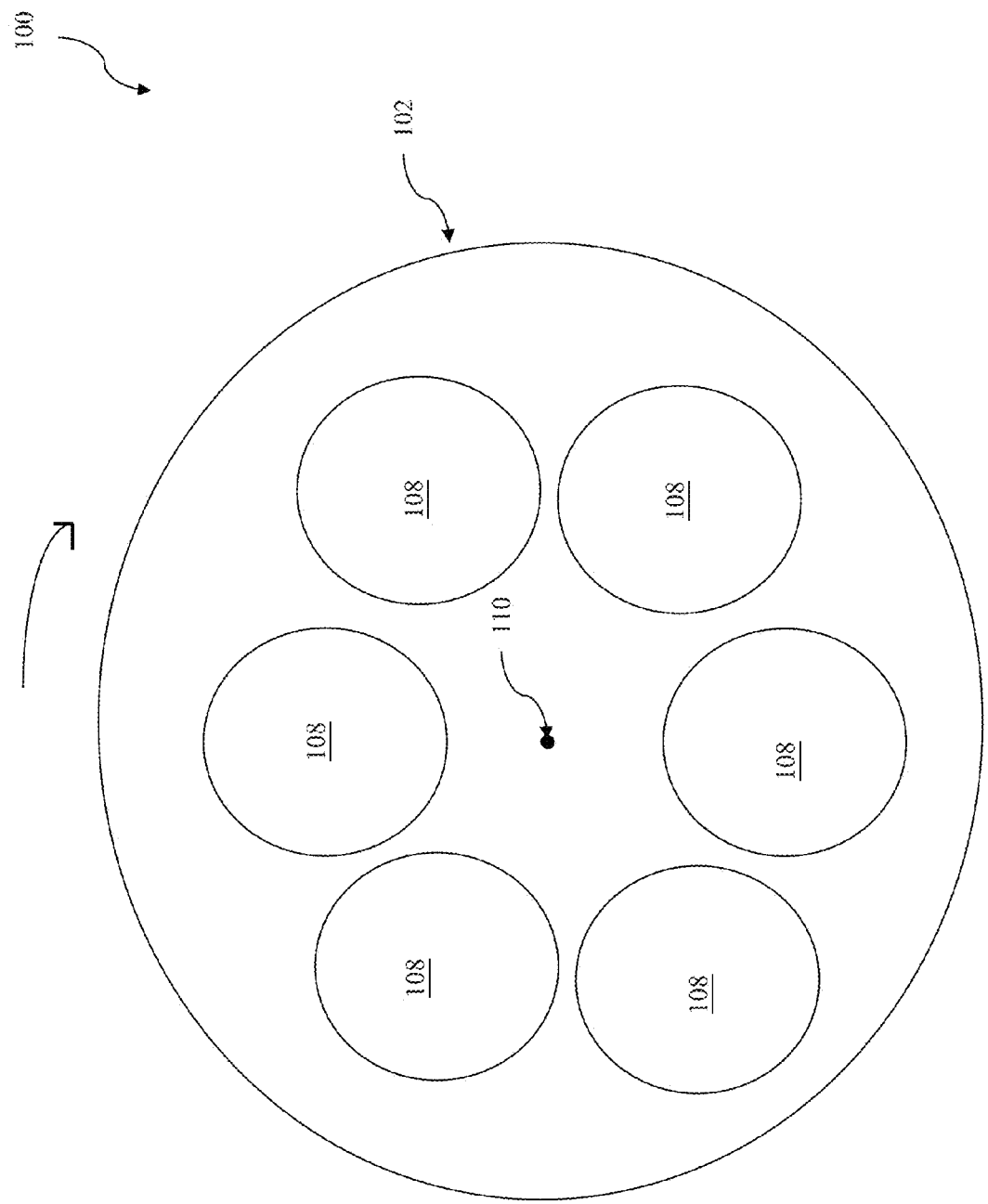
FIGS. 2, 3, 4, 6, 7 and 8 are schematic and top views of a SALD module in FIG. 1, constructed in accordance with some embodiments.

FIG. 1 illustrates a schematic and sectional view of a spatial atomic layer deposition (SALD) module 100 in accordance with some embodiments. FIG. 2 is a top view of the SALD module 100, in portion, in accordance with some embodiments. The SALD module 100 includes a processing chamber 102. The processing chamber 102 includes an upper portion 102A and a lower portion 102B integrated together, defining an enclosed space 104 between the upper and lower portions. The SALD module 100 includes a substrate stage 106 designed to secure one or more semiconductor substrate 108, such as six semiconductor substrates in one example. In some examples, the substrate stage 106 may include a vacuum chuck to secure the semiconductor wafer(s) 108. The substrate stage 106 further includes a mechanism to rotate around a center axis 110, which is perpendicular to the semiconductor substrate (s) 108 secured thereon and passes the center of the substrate stage 106. In some examples, the substrate stage 106 includes a rotation structure and a motor integrated to enable the rotation of the substrate stage 106. The semiconductor substrate(s) 108 secured on the substrate stage 106 moves along with the substrate stage 108 when the substrate stage 106 rotates.

In some embodiments, a semiconductor substrate 108 is a silicon wafer. In some embodiments, the semiconductor substrate 104 may include an elementary semiconductor, such as germanium in a crystalline structure; a compound semiconductor, such as silicon germanium, silicon carbide, gallium arsenic, gallium phosphide, indium phosphide, indium arsenide, and/or indium antimonide; or combinations thereof. In furtherance of the embodiments, those semiconductor material films may be epitaxially grown on the silicon wafer. In some other embodiments, the substrate 104 may be a semiconductor wafer of a different material (such as silicon carbide) or a substrate of some other material (such as a glass substrate).

The semiconductor wafer 108 has a front surface 108A and a backside surface 108B opposing from each other. One or more integrated circuits are formed, partially formed, or to-be formed on the front surface 108A of the semiconductor wafer 108. Therefore, the front surface 108A of the semiconductor wafer 108 may include a patterned material layer or a material layer to be patterned. For examples, the front surface 108A may include various isolation features (such as shallow trench isolation features), various doped features (such as doped wells, or doped source and drain features), various devices (such as transistors), various conductive features (such as contacts, metal lines and/or vias of an interconnection structure), packaging material layers (such as bonding pads and/or a passivation layer), or a combination thereof. On a completely fabricated semiconductor wafer, all above material layers and patterns may present on the front surface 108A of the semiconductor wafer 108. In the present example, the semiconductor wafer 108 is still in the fabrication, a subset of the above material layers may be formed on the front surface 108A. The axis 110 is perpendicular to the top surface 108A and the backside surface 108B of the semiconductor wafer 108 secured on the substrate stage 106 or the front surface of the substrate stage 106. Even tough, the top surface 108A of the wafer may be patterned and has a topographical profile but, globally it is flat and parallel with the backside surface 108B.

Figure 3:
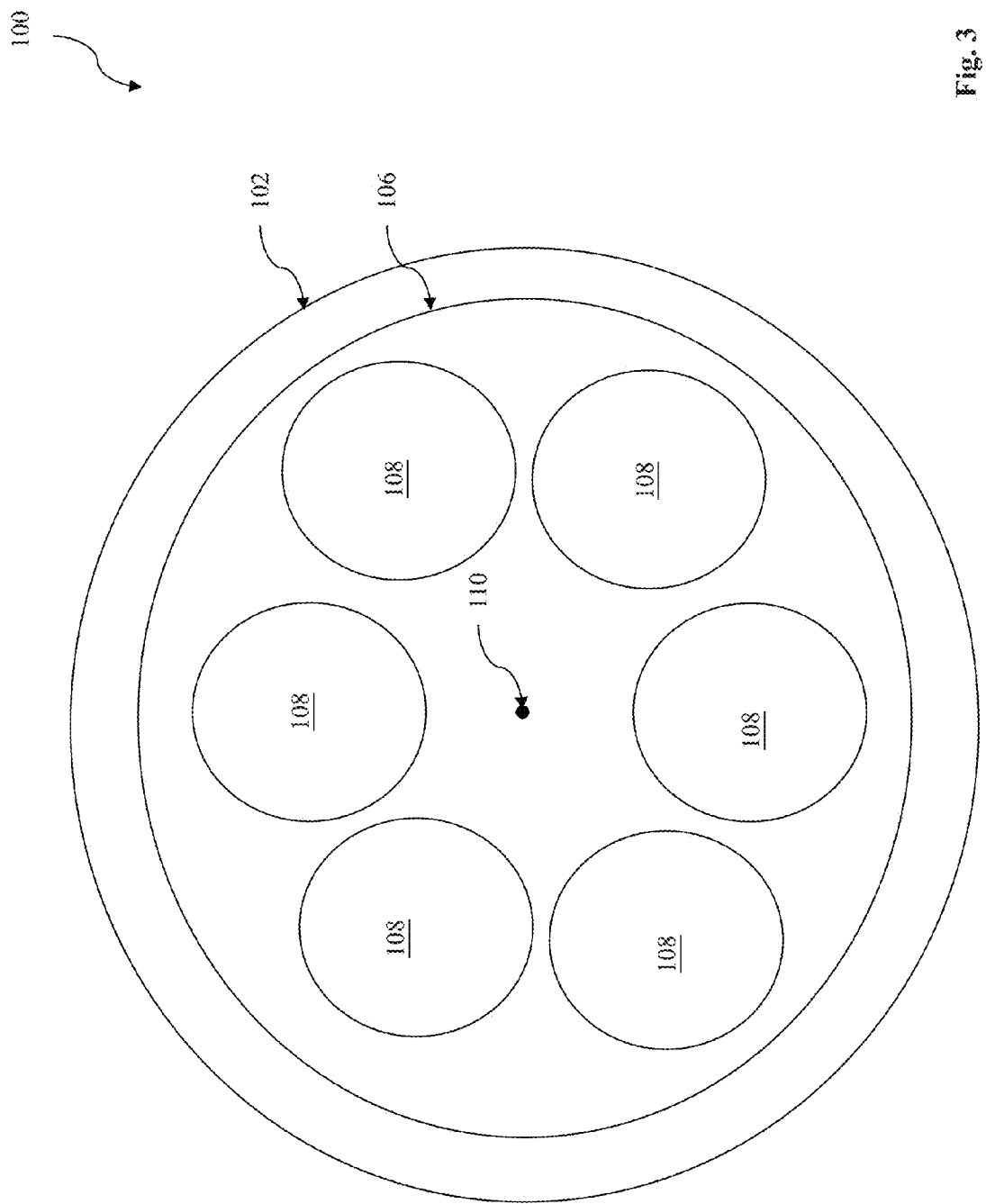

FIG. 3 is a schematic and top view of the SALD module 100, in portion. The processing chamber 102 is further illustrated in FIG. 3. The SALD module 100 includes various features designed and configured to define various reaction zones. Thus, each wafer 108 secured on the substrate stage 106 passes through various reaction zones and completes one reaction cycle when the substrate stage 106 rotates one circle. In some embodiments, the processing chamber 102 has a round shape in the top view and has a radius greater than the diameter of the wafer 108. In some examples, the radius of the processing chamber 102 ranges between 70 cm and 80 cm.

Figure 4:
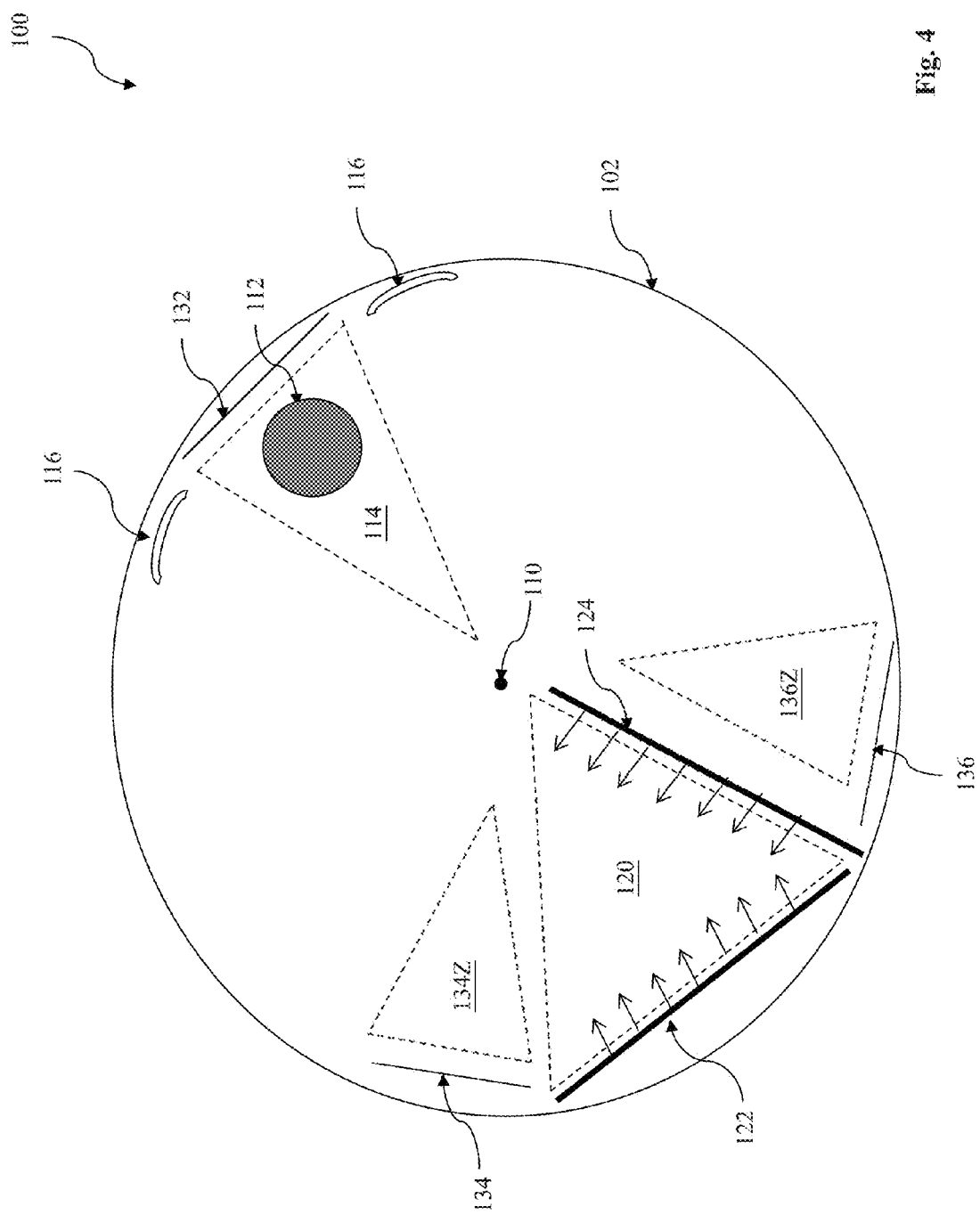

FIG. 4 is a schematic and top view of the SALD module 100 in portion, constructed in accordance with some embodiments. The SALD module 100 includes a first chemical delivery mechanism 112 to provide a first chemical to the first reaction zone 114, also referred to as precursor absorption area. In some embodiments, the first chemical delivery mechanism 112 includes a top spray head configured on the upper portion 102A of the processing chamber to deliver the first chemical toward the substrate stage 106 within the first reaction zone 114. In some embodiments, the top spray head is configured such that the first chemical is delivered to the wafer 108 in a direction perpendicular to the front surface 108A of the wafer 108 secured on the substrate stage 106. In some examples for illustration, the first chemical includes dichlorosilane ($SiH_2Cl_2$ or DCS); hexachlorodisilane ($Si_2Cl_6$ or HCD); Bis(TertiaryButylAmino)Silane ($C_8H_{22}N_2Si$ or BTBAS); trimethylaluminium ($Al_2(CH_3)_6$ or TMA), or other suitable chemicals, depending the film to be formed.

Other features are configured to further maintain the first reaction zone 114. In some embodiments, air edge mechanisms 116 are configured on both sides of the first reaction zone 114 to constrain the first chemical from diffusion and isolate the first reaction zone from other reaction zones. The air edge mechanisms 116 are coupled to an inert gas (such as nitrogen or argon) source and provide the inert gas, forming gas walls to maintain and isolate the first reaction zone 114. When the wafer 108 is in the first reaction zone 114, the first chemical is deposited (or adsorbed) on the front surface 108A of the wafer 108.

The SALD module 100 includes a second chemical delivery mechanism to provide a second chemical to the second reaction zone 120, also referred to as reaction treatment area. In the present embodiment, the second chemical delivery mechanism includes an edge chemical injector 122 configured on the edge of the processing chamber 102, and further includes a radial chemical injector 124 configured on a different direction, particularly along the radial direction on one side of the second reaction zone 120. Both the edge and radial chemical injectors (122 and 124) are elongated and the length dimensions are properly oriented. Here the edge of the processing chamber 102 refers to the perimeter of the processing chamber 102 relative to the radial direction. The radial direction refers to a direction from the edge to the center 110 of the processing chamber. The radial chemical injector 124 may be oriented along a direction slightly off the corresponding radial direction, such as providing freedom for fining tuning chemical uniformity and deposition uniformity. For example, the length dimension is oriented in a direction that has an angle of less than 15° with the corresponding radial direction.

The radial chemical injector 124 substantially spans from the edge to the center 110 of the processing chamber 102, such as spanning at least 80% of the radius R or at least 90% of R in some embodiments.

The two chemical injectors are configured along two directions. The second chemical is delivered to the second reaction zone 120 from two directions by the injectors 122 and 124, respectively, as illustrated in FIG. 4.

The chemical injectors are thus configured to deliver the second chemical to the second reaction zone 120. In some examples for illustration, the second chemical includes ammonia ($NH_3$), argon, nitrogen ($N_2$), hydrogen ($H_2$), helium (He), carbon dioxide ($CO_2$), oxygen ($O_2$), ozone ($O_3$), water ($H_2O$), hydrogen peroxide ($H_2O_2$), boron precursor, or other suitable chemicals, depending the film to be formed. When the wafer 108 is in the second reaction zone 120, the second chemical is delivered to the wafer and is further reacted with the previously adsorbed first chemical to form one atomic layer of the film on the wafer, thus completing one cycle.

Figure 5A:
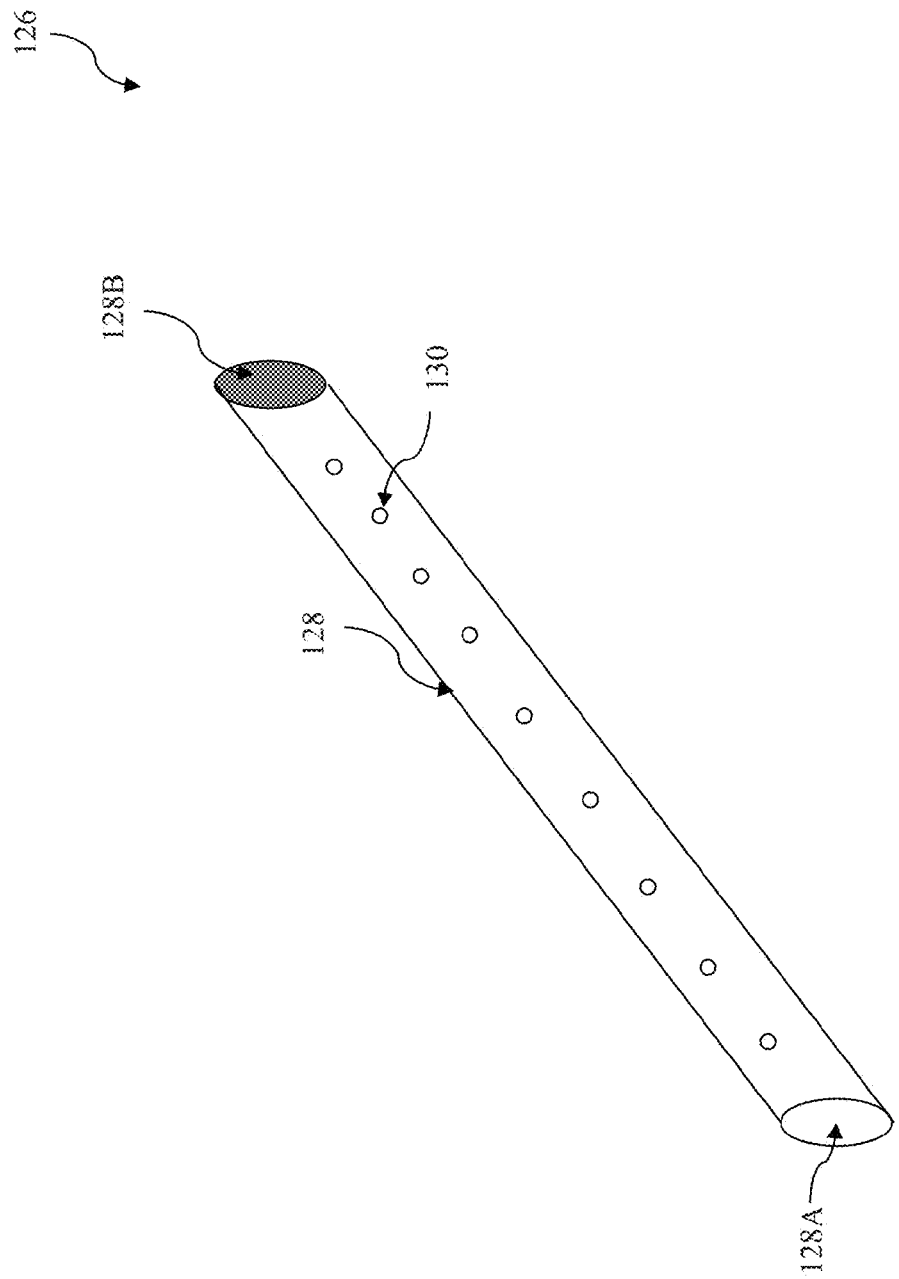
FIG. 5A is a schematic view of a chemical injector of the SALD module in FIG. 1, constructed in accordance with some embodiments.

A chemical injector 126 is illustrated schematically in FIG. 5A, constructed in accordance with some embodiments. The chemical injector 126 is an example of the edge chemical injector 122 or the radial chemical injector 124. The chemical injector 126 includes a tube 128 with one end 128A coupled to a chemical source for the second chemical and another end 128B sealed. The tube 128 is designed to have a plurality of openings 130 with size, location and configuration to effectively and uniformly inject the second chemical to the second reaction zone 120. In some examples, the chemical injector 126 may have a length ranging between 300 mm and 600 mm. The openings 130 may have a diameter ranging between 0.2 mm and 1.2 mm. The number of the openings 130 may range between 10 and 200.

Back to FIG. 4, the edge chemical injector 122 and the radial chemical injector 124 are integrated to the processing chamber 102 in a configuration so that both are higher than the wafer 108 on the substrate stage 106, such as higher than the wafer 108 with a relative height ranging between 2 mm and 10 mm. the SALD module 100 further includes other isolation mechanism to maintain and separate various reaction zones. For examples, various exhaust mechanisms 132, 134 and 136, such as pumps, are configured at different locations of the processing chamber 102. Thus, the chemical diffused out of the targeted zone is pumped out and further diffusion to other regions is avoided. In the present example illustrated in FIG. 4, the exhaust mechanism 132 is configured on the edge of the processing chamber 102 in the first reaction zone 114. In this case, the first chemical is delivered from the first chemical delivery mechanism 112 toward the wafer 108 within the first reaction zone 114 and is exhausted by the exhaust mechanism 132 when it reaches to the edge of the first reaction zone 114. The exhaust mechanisms 134 and 136 are configured on both sides of the second reaction zone 120 to exhaust the second chemical diffused out of the second reaction zone 120. The exhaust mechanisms purge the chemical from previous reaction zone and prepare the wafer surface for the next chemical. The exhaust mechanisms provide corresponding respective purge zones, such as purge zones 134Z and 136Z. The second reaction zone 120 with thus configured chemical injectors has more uniform distribution of the second chemical, therefore more uniform chemical reaction rate, uniform film thickness and film quality.

Figure 6:
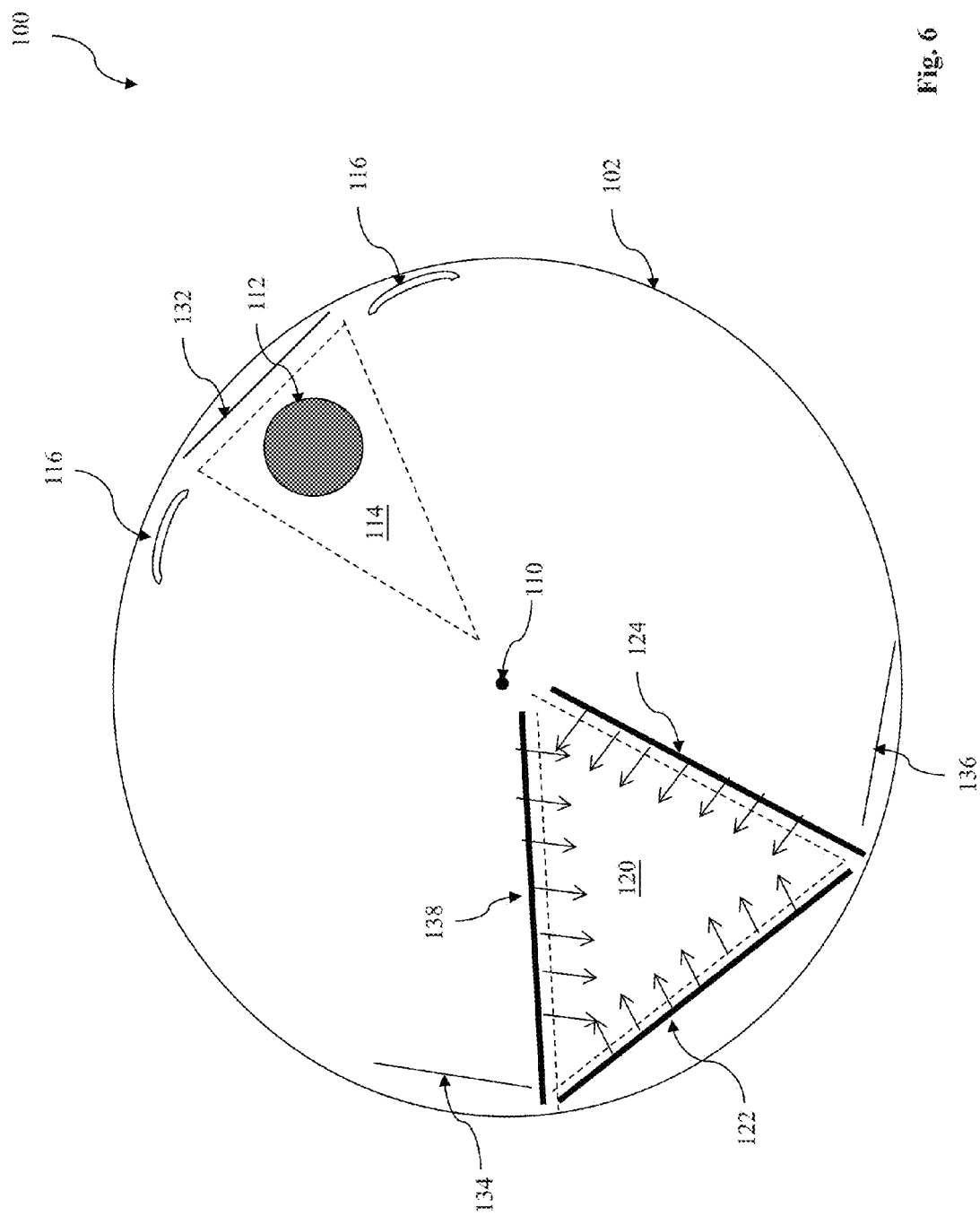

The SALD module 100 may further include other features and other reaction zones. FIG. 6 is a schematic and top view of the SALD module 100 in accordance with some other embodiments. The SALD module 100 further includes another radial chemical injector 138 configured on another side of the second reaction zone 120. The radial chemical injector 138 is substantially similar to the chemical injector 124 in term of design, structure and dimensions. The radial chemical injector 138 is also configured radially from the edge to the center 110 of the processing chamber 102 on the other side of the second reaction zone 120. In the present embodiment, the radial chemical injectors 124 and 138 are symmetrically configured on sides of the second reaction zone 120, forming a central angle. Furthermore, the chemical injectors 122, 124 and 138 are configured to enclose a triangle region as the second reaction zone 120. In some embodiments, the edge chemical injector 122 may be bended to match the sidewall of the processing chamber 102. For example, the edge chemical injector 122 is curved to an arc. Thus, the chemical injectors 122, 124 and 138 are configured to enclose a circular sector as the second reaction zone 120.

Thus, the three chemical injectors are configured in different directions and substantially enclose the second reaction zone 120, thereby maintaining a more uniform and high pressure of the second chemical in the second reaction zone 120, with less diffusion to the outside. Accordingly, the deposition rate and film quality are improved.

Figure 7:
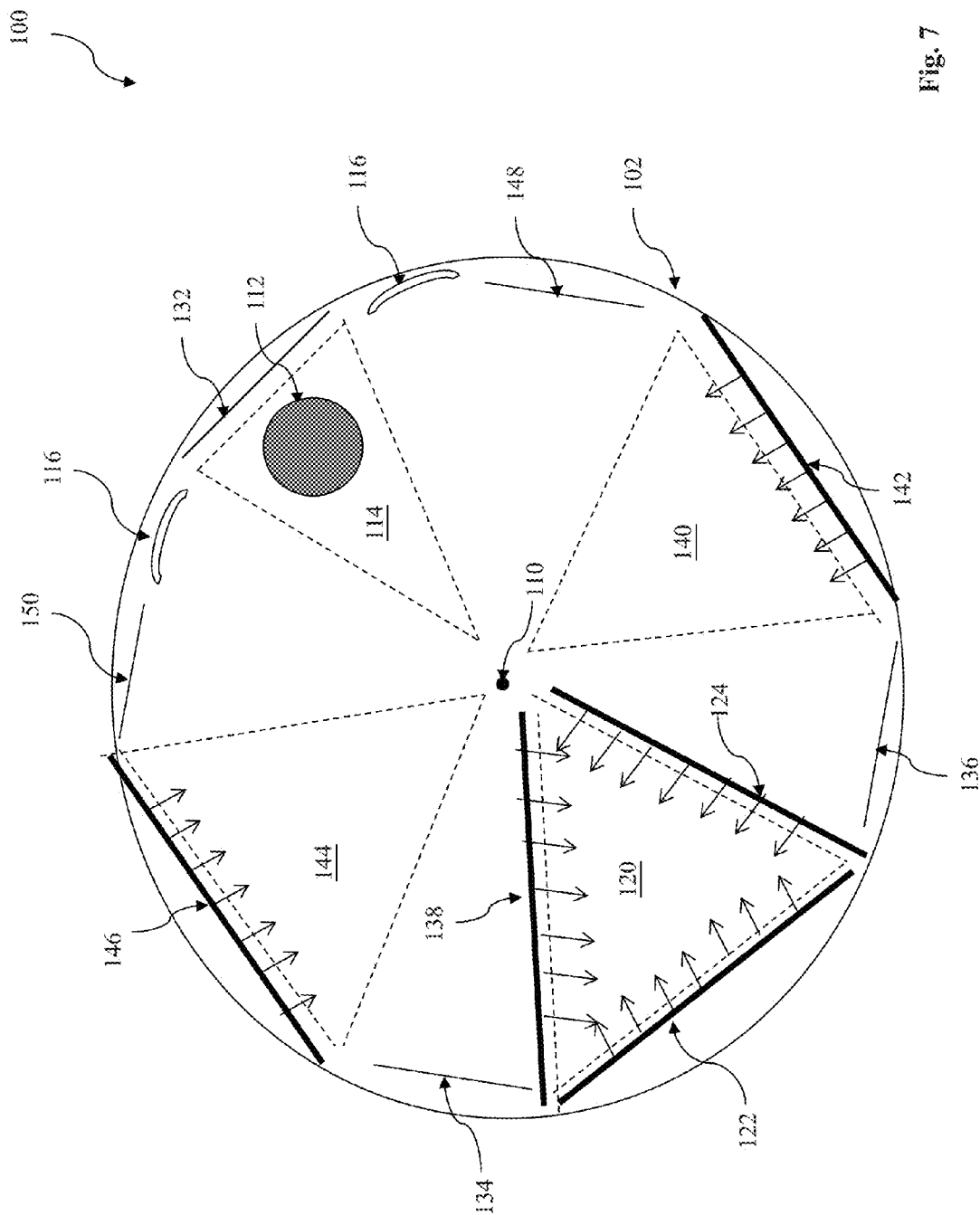

FIG. 7 is a schematic and top view of the SALD module 100 in accordance with some other embodiments. The SALD module 100 further includes a pre-reaction zone 140 for initial deposition of the second chemical. The pre-reaction zone 140 may function in various perspectives, such as initializing the chemical condition and further purge the first chemical. In the pre-reaction zone 140, an edge chemical injector 142 is configured to provide the second chemical. The edge chemical injector 142 may be similar to the edge chemical injector 122 (such as straight or curved in various embodiments). The edge chemical injector 142 has a length that may be different from (such as shorter than) that of the edge chemical injector 122, depending on the deposition efficiency, diffusion and purge effects of other regions. Since the second chemical in the second reaction zone 120 is maintained with high and uniform density, and the diffusion of the second chemical is minimized, the edge chemical injector 122 may be designed with a shorter length, and the edge chemical injector 142 may be designed with a longer length. Thus, the second reaction zone 120 is enlarged, the rotation of the substrate stage 102 can be increased and the throughput is also increased. The edge chemical injector 140 is also connected to a chemical source for the second chemical.

Still referring to FIG. 7, the SALD module 100 further includes a post-reaction zone 144 for post deposition of the second chemical. The post-reaction zone 144 may function in various perspectives, such as finalizing and completing the chemical reaction in the second reaction zone 120. In the post-reaction zone 144, an edge chemical injector 146 is configured to provide the second chemical. The edge chemical injector 146 may be similar to other edge chemical injectors in structure, such as same to the edge chemical injector 142 in terms of design, structure and dimensions. The edge chemical injector 146 is also connected to a chemical source for the second chemical.

Still referring to FIG. 7, the SALD module 100 may further include other isolation mechanisms, such as an exhaust mechanism 148 configured between the pre-reaction zone 140 and the air edge mechanism 116 for further purge and isolation functions. In some examples, the SALD module 100 may further include an exhaust mechanism 150 configured between the post-reaction zone 144 and the air edge mechanism 116 for further purge and isolation functions.

Figure 8:
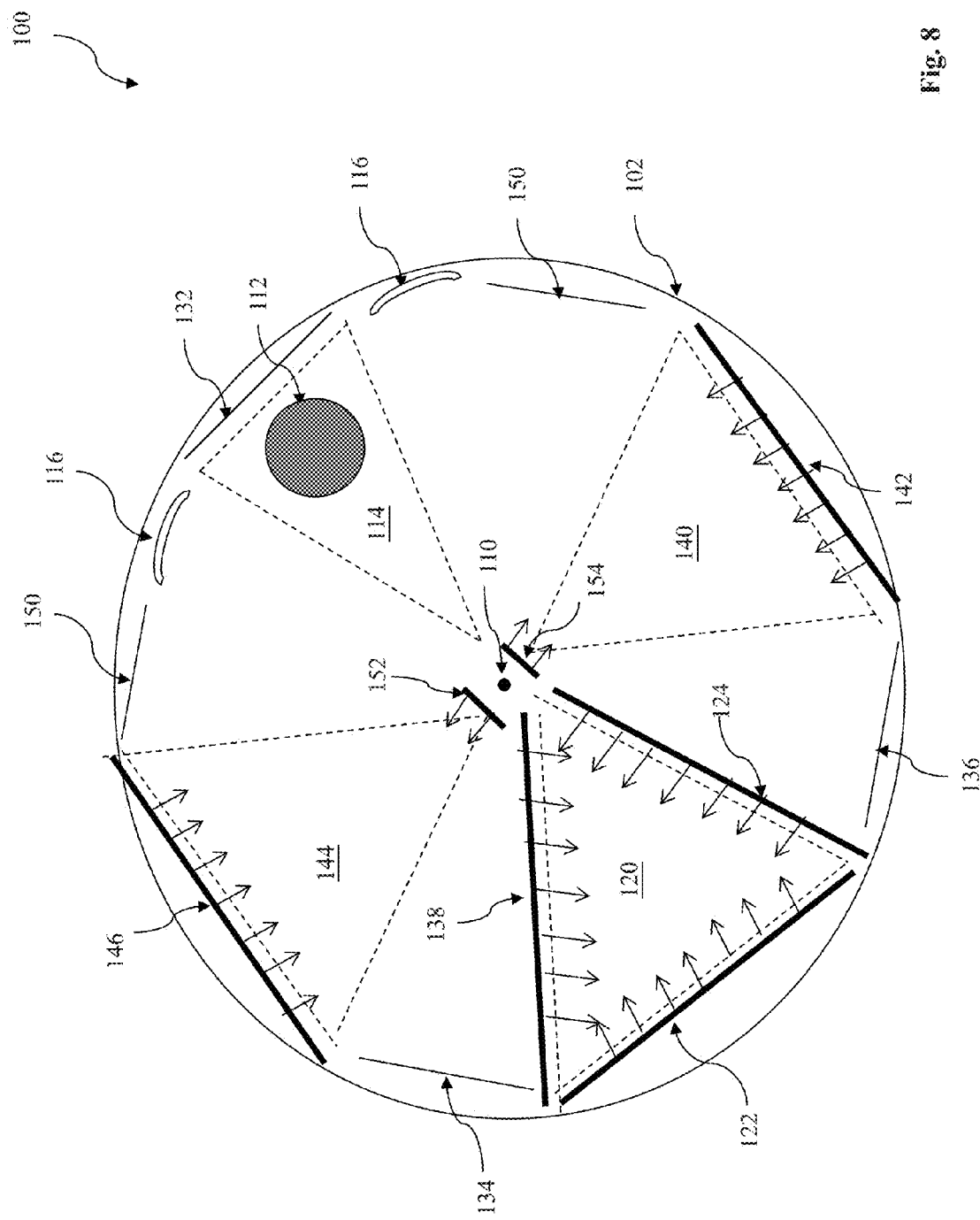

FIG. 8 is a schematic and top view of the SALD module 100 in accordance with some other embodiments. The SALD module 100 further includes one or more inner chemical injectors configured in or close to the center of the processing chamber and above the wafer 108 on the substrate stage 106 to provide additional supply of the second chemical from different directions. In some examples, a first inner chemical injector 152 is configured in the center to provide the second chemical to the post-reaction zone 144 in the direction opposite to the direction of the second chemical provided by the edge chemical injector 146. In some example, the first inner chemical injector 152 is configured to face the chemical injector 146 and parallel with the edge chemical injector 146. The first inner chemical injector 152 may be similar to other chemical injectors in structure, such as same to the chemical injector 126 in FIG. 5 but with different length and different design parameters, such as the length, the number of openings and/or the diameter of the openings. The first inner chemical injector 152 is also connected to a chemical source for the second chemical.

In some examples, a second inner chemical injector 154 is additionally or alternatively configured in the center to provide the second chemical to the pre-reaction zone 140 in the direction opposite to the direction of the second chemical provided by the chemical injector 142. In some examples, the second inner chemical injector 154 is configured to face the chemical injector 142 and parallel with the chemical injector 142. The second inner chemical injector 154 may be similar to the first inner chemical injector 152 in structure and sizes. The second inner chemical injector 154 is also connected to a chemical source for the second chemical.

The SALD module 100 may further include other components, such as valve associated with each chemical injector to control the respective gas flow and gas pressure in the respective reaction zone. Alternatively, all chemical injectors are connected to a same source of the second chemical, and a master value is integrated to control the gas flows to the all chemical injectors. In some examples, the second reaction zone 120 may be controlled to have a partial chemical pressure up to 10 Torr. In some examples, the SALD module 100 includes another valve configured between the first chemical delivery mechanism 112 and the first chemical source connected to the first chemical delivery mechanism 112 to control the flow rate and the gas pressure in the first reaction zone 114. For examples, the partially pressure of the first chemical in the first reaction zone 114 is controlled to up to 2 Torr.

Various configurations and designs are provided above. Additional components and features may be further added to the SALD module 100. Other alternatives may be used without departure from the scope of the present disclosure. For examples, the radial chemical injector 124 (or 138) may be configured along the radial direction toward the axis 110. Alternatively, the radial chemical injector 124 (or 138) may be configured along a direction away from the radial direction, such as having an angle of up to 15° with the corresponding radial direction. In other examples, one or more heaters may be configured in the processing chamber 102, such as embedded in the substrate stage 106 for thermal heating effect during deposition. In some embodiments, the SALD module 100 also includes dielectric plate configured in the processing chamber and connected to electric source for generating plasma in the second reaction zone. For example, the radial chemical injector 124 is parallel with the dielectric plate.

Figure 9:
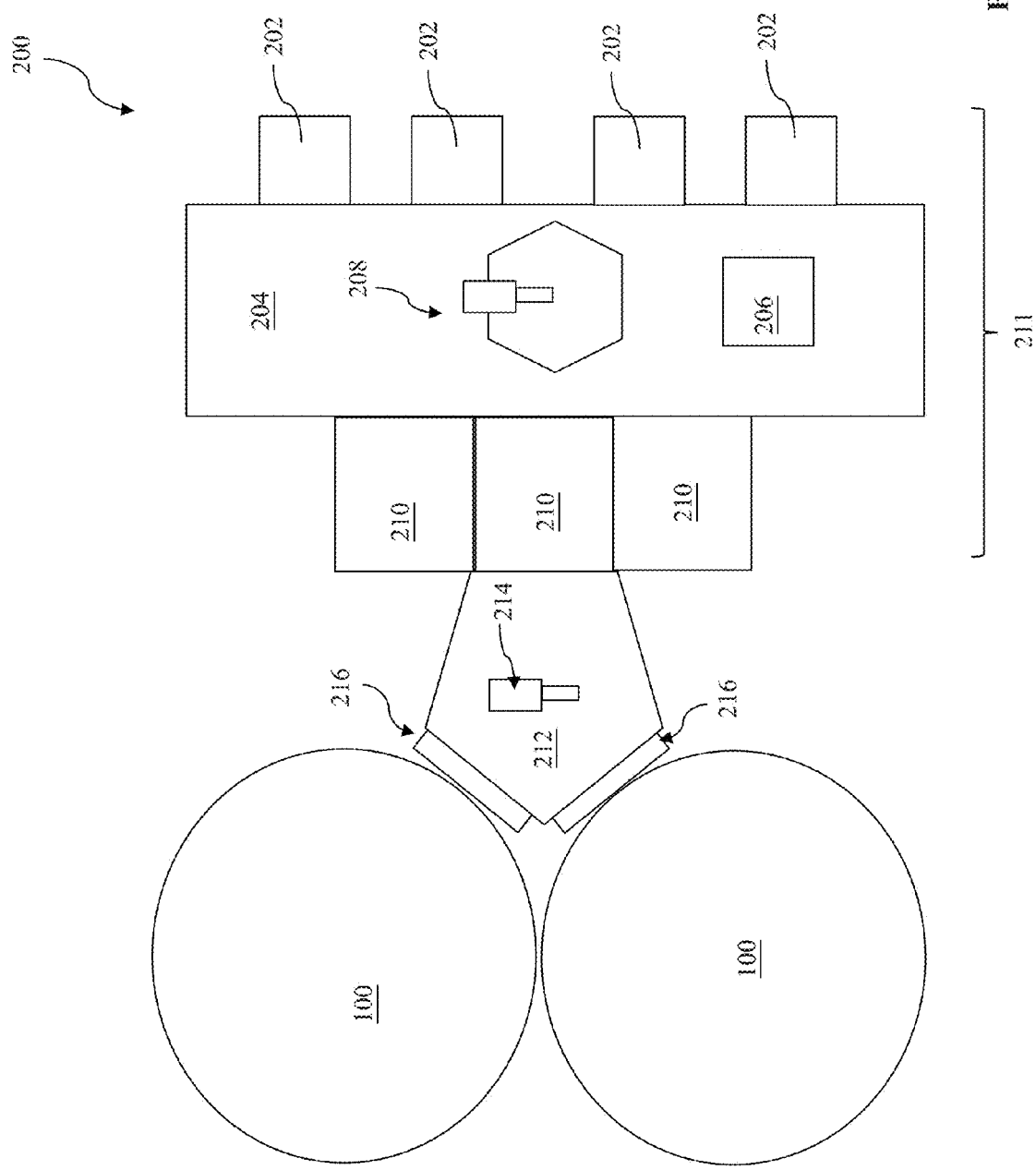
FIG. 9 is a block diagram of a SALD system having a SALD module of FIG. 1, constructed in accordance with some embodiments.

FIG. 9 is a block diagram of a SALD system 200 in accordance with some embodiments. The SALD system 200 includes one or more SALD modules 100 integrated together in a cluster tool. In an illustrative embodiment, the SALD system 200 includes two SALD modules 100 properly configured and integrated.

The SALD system 200 includes one or more load port 202, through which wafers are loaded and unloaded to the SALD system 200. In the present embodiments, the wafers are loaded and unloaded in batches, by using wafer containers, such as front opening unified pods (FOUPs).

The SALD system 200 may include a loader (or front end unit) 204 for holding, manipulating and transferring wafers. For examples, the loader 204 includes one or more substrate stage 206 for holding and/or orienting one or more wafer. In other examples, the loader 204 includes one or more robot 208 for handling wafers, such as transferring wafers to the SALD modules 100 or to load lock chambers (or load lock units) 210. The robot 208 is configured between the load port 202 and the load lock chambers in a way for proper wafer transferring therebetween. For example, each wafer is transferred by the robot 208 from the load port 202 or from the substrate stage 206 to one of load lock chambers, or is transferred back to the load port 202 by the robot 208. In some embodiments, the SALD system 200 may further include other components, such as one or more load lock chambers 210 configured and designed for various functions, such as pre-orientation and preconditioning. The preconditioning may include degassing, pre-heating or other functions. For examples, multiple load lock chambers 210 may designed and configured for various preconditioning functions, respectively. In some examples, a wafer is oriented, degassed and/or pre-heated in one of the load lock chambers 210 to prepare the wafer for the SALD processing. The SALD system 200 may be configured differently. For example, the load lock chamber 120 in the middle may be used as a path to transfer the wafer(s). In other examples, the SALD system 200 further includes a vacuum module integrated to provide vacuum conditions to respective regions, such SALD modules 100. The load ports 202, the loader 204 and the load lock chambers 210 are collectively referred to as a load lock module 211.

The SALD system 200 may further include a transfer module 212 for wafer transfer between the SALD modules 100 and the load lock units 210. In some embodiments, the transfer module 212 further includes one or more robot 214 for wafer transferring. The transfer module 212 has openings (doors) 216 connected to the SALD modules 100, respectively.

Figure 10:
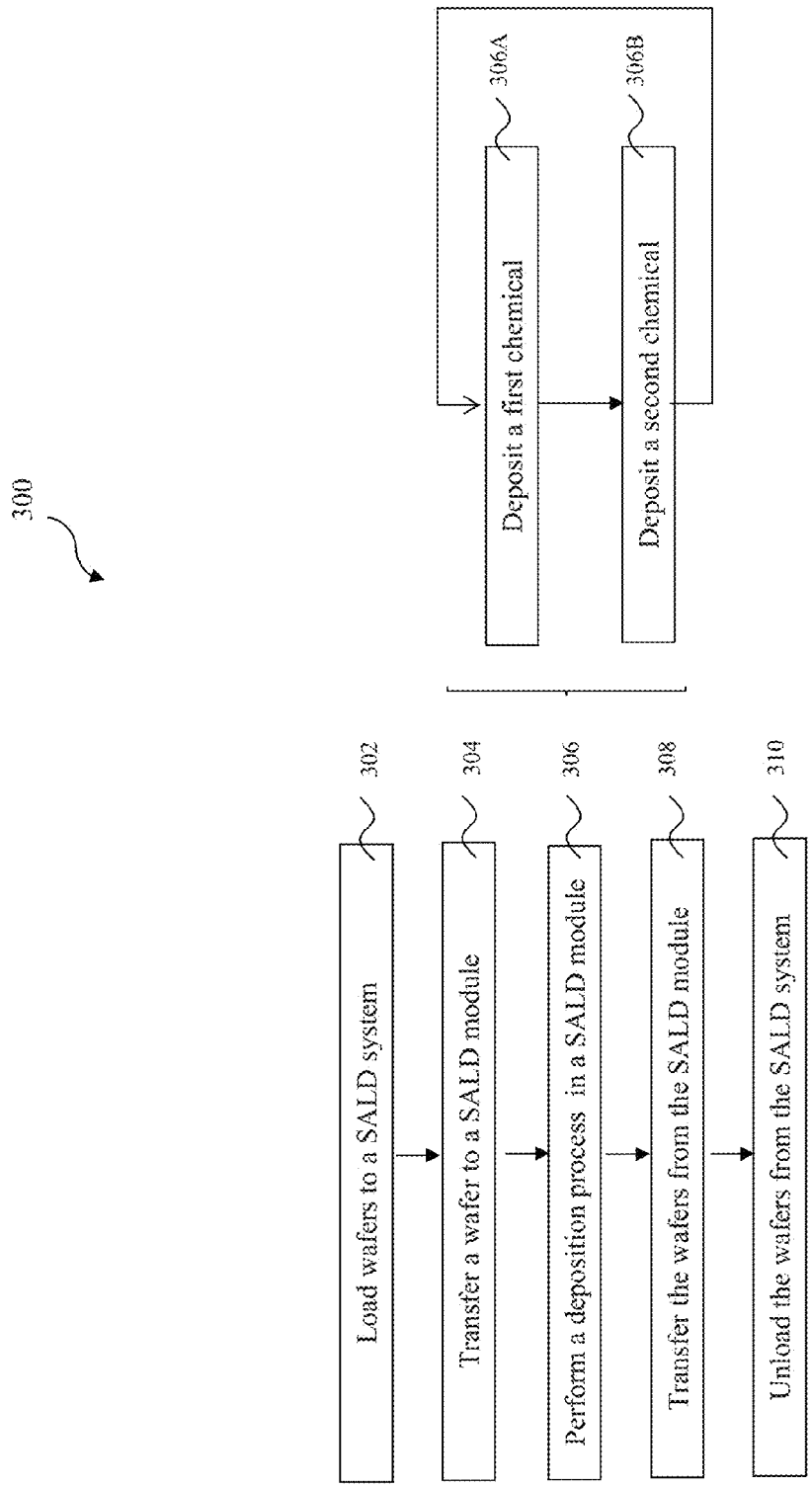
FIG. 10 is a flowchart of a method utilizing the SALD system of FIG. 10, constructed in accordance with some embodiments.

FIG. 10 is a flowchart of a method 300 fabricating (particularly, depositing a thin film to by SALD technique) one or more semiconductor wafers 108, in accordance with some embodiments. The method 300 is implemented in the SALD system 200 of FIG. 9. The method 300 is described with reference to FIGS. 9, 10 and other figures.

The method 300 includes an operation 302 to load one or more wafers to the SALD system 200 through the load ports 202. For example, wafers are in one or more batches, such as in FOUPs, are loaded to the SALD system 200 through the load ports 202 in one or more steps, such as loading, degassing, pre-heating, orienting or a subset thereof.

The method 300 includes operation 304 to transfer one or more wafer to one of the SALD module 100 by the robot 214 through the opening 216. For example, the robot 214 sequentially transfers 6 wafers to each of the SALD modules 100. In other examples, the transfer module 212 may include two or more robots 214 to simultaneously transfer wafers to respective SALD modules 100. Specifically, in the present embodiment, six wafers 108 are transferred to the substrate stage 106 of the corresponding SALD module 100 in a configuration that the front surface 108A faces upward, as illustrated in FIG. 1.

The method 300 proceeds to an operation 306 to perform a deposition process to the wafer(s) 108 in one of the SALD modules 100. The operation 306 and following operations are described with one SALD module and one wafer. However, as described above, the multiple wafers (such as 6 wafers) may be processed in one of multiple SALD modules 100 and the multiple SALD modules 100 may work in parallel. In the present embodiment, a thin film is deposited on the front surface 108A of each wafer 108 during the operation 306.

During the deposition process, various components and units of the SALD system 200 work collectively and synergistically. Accordingly, the operation 306 includes various sub-operations. Especially, the operation 306 includes a sub-operation 306A to deposit a first chemical; and a sub-operation 306B to deposit second chemical.

The operation 306 may further include other sub-operations, such as rotating the substrate stage 106. In the present embodiments of the operation 306, the substrate stage 106 secures the wafer 108 and rotates the wafer around the axis 110, such as in a clockwise mode. This sub-operation lasts through the deposition process in the operation 306. Each wafer 108 will sequentially pass each zone, such as the first reaction zone 114 and the second reaction zone 120. In other examples, each wafer 108 will sequentially pass the first reaction zone 114, the pre-reaction zone 140, the second reaction zone 120, and the post-reaction zone 144. Additionally, the wafer 108 will pass various isolation regions (such as air edges associated with the respective air edge mechanisms 116 and the purge regions associated with the respective exhaust mechanisms respectively) from one reaction zone to another reaction zone. As an example for illustration, in the first reaction zone 114, the first chemical is delivered to the wafer 108 and adsorbed to the front surface 108A of the wafer 108. In the second reaction zone 120, the second chemical is delivered to the wafer 108 and reacted with the first chemical adsorbed on the front surface 108A, thereby forming an atomic layer on the front surface 108A of the wafer 108. One rotation circle of the substrate stage 106 completes one cycle of the deposition process. One cycle forms one atomic layer. The operation 306 may continue as many cycles as needed to form the thin film with desired thickness. Particularly, when the wafer 108 is in the second reaction zone 120, with the side chemical injector 122 and the radial chemical injector 124 (or additionally the radial chemical injector 138), the second chemical delivered to the second reaction zone 120 has a more uniform distribution and a high density, therefore increasing the deposition rate and improving the deposition quality. Since the second chemical is substantially maintained and controlled inside the second reaction zone 120, the purge zones and purge times may be substantially reduced, therefore increasing the throughput and decreasing the manufacturing cost.

After the completion of the deposition process to the wafer 108 in the SALD modules 100 by the operation 306, the method 300 proceeds to an operation 308 to transfer the wafer 108 to the load lock chamber(s) 210 by the robot 214. This operation is similar to the operation 304 but it is reversed. For example, the multiple wafers are transferred to the load lock chambers 210 from the SALD modules 100, sequentially or in parallel by multiple robots 214.

The method 300 may further include an operation 310 to unload the wafers from the SALD system 200 through the load port 202. The method 300 may include other operations, before, during or after the operations described above. For example, after the operation 310, the wafers may be transferred to other fabrication tools for following fabrications, such as lithography patterning process.

The SALD system 200 and the method 300 may have other embodiments, or alternatives. For examples, even though the method 300 describes a procedure to form a thin film on a wafer by SALD technique, the SALD system and the method utilizing the same may be used to form various thin films, such as gate dielectric layer, a gate electrode layer, a capping layer, a barrier layer, an etch stop layer or a dielectric layer for a capacitor.

The present disclosure provides a SALD system and a method utilizing the same. By utilizing the disclosed SALD system, the SALD deposition rate and quality are improved. The SALD system includes a second reaction zone configured with two or three chemical injectors oriented along the edge and the radial directions (or proximate radial directions) of the substrate stage.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed SALD system and the method, the deposition rate and film quality are improved. Other advantages may include less purge time, less manufacturing cost and higher manufacturing throughput.

Thus, the present disclosure provides a semiconductor fabrication apparatus in accordance with one embodiment. The apparatus includes a processing chamber; a wafer stage configured in the processing chamber, the wafer stage is operable to secure and rotate a plurality of wafers around an axis; a first chemical delivery mechanism configured in the processing chamber to provide a first chemical to a first reaction zone in the processing chamber; and a second chemical delivery mechanism configured in the processing chamber to provide a second chemical to a second reaction zone in the processing chamber. The second chemical delivery mechanism includes an edge chemical injector and a first radial chemical injector.

The present disclosure provides a semiconductor fabrication system in accordance with one embodiment. The semiconductor fabrication system includes a load lock module to load and unload plurality of wafers; a transfer module integrated with the load lock module; and a plurality of spatial atomic layer deposition (SALD) modules integrated with the transfer modules. Each SALD module includes a processing chamber; a wafer stage configured in the processing chamber, the wafer stage is operable to secure and rotate the plurality of wafers around an axis; a first chemical delivery mechanism configured in the processing chamber to provide a first chemical to a first reaction zone in the processing chamber; and a second chemical delivery mechanism configured in the processing chamber to provide a second chemical to a second reaction zone in the processing chamber. The second chemical delivery mechanism includes an edge chemical injector and a first radial chemical injector.

The present disclosure provides a method in accordance with one embodiment. The method includes loading a plurality of wafers to a spatial atomic layer deposition (SALD) module; performing a deposition process to the plurality of wafers in the SALD module; and thereafter, unloading the plurality wafers from the SALD module. The SALD module includes a processing chamber; a wafer stage configured in the processing chamber, the wafer stage is operable to secure and rotate the plurality of wafers around an axis; a first chemical delivery mechanism configured in the processing chamber to provide a first chemical to a first reaction zone in the processing chamber; and a second chemical delivery mechanism configured in the processing chamber to provide a second chemical to a second reaction zone in the processing chamber. The second chemical delivery mechanism includes an edge chemical injector and a first radial chemical injector.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor fabrication apparatus, comprising:
a processing chamber;
a wafer stage configured in the processing chamber, the wafer stage is operable to secure and rotate a plurality of wafers around an axis of the processing chamber;
a first chemical delivery mechanism configured in the processing chamber to provide a first chemical to a first reaction zone in the processing chamber;
a second chemical delivery mechanism configured in the processing chamber to provide a second chemical to a second reaction zone in the processing chamber, wherein the second chemical delivery mechanism includes an edge chemical injector and a first radial chemical injector; and
an air edge mechanism to provide a first air edge zone on one side of the first reaction zone and a second air edge zone on another side of the first reaction zone.

2. The semiconductor fabrication apparatus of claim 1, wherein
the edge chemical injector is configured at an edge of the processing chamber; and the first radial chemical injector is configured with its length oriented from the edge of the processing chamber to the axis.

3. The semiconductor fabrication apparatus of claim 1, wherein the first radial chemical injector is configured with its length oriented in a direction that has an angle less than 15° with a corresponding radial direction.

4. The semiconductor fabrication apparatus of claim 1, further comprising a second radial chemical injector configured to enclose the second reaction zone.

5. The semiconductor fabrication apparatus of claim 4, wherein the second radial chemical injector is configured with its length oriented toward to the axis, and the first and second radial chemical injectors form a central angle.

6. The semiconductor fabrication apparatus of claim 5, wherein the edge chemical injector, the first radial chemical injector and the second radial chemical injector are configured to enclose a circular sector as the second reaction zone.

7. The semiconductor fabrication apparatus of claim 1, wherein the first radial chemical injector includes a tube with a length and a plurality of openings formed on the tube.

8. The semiconductor fabrication apparatus of claim 7, wherein
the length of the first radial chemical injector ranges between 300 mm and 600 mm;
a number of the openings ranges between 10 and 200; and
a diameter of the openings ranges between 0.2 mm and 1.2 mm.

9. The semiconductor fabrication apparatus of claim 1, wherein the edge chemical injector includes a tube with a length and a plurality of openings formed on the tube.

10. The semiconductor fabrication apparatus of claim 1, wherein the first chemical delivery mechanism is connected to a first chemical source that delivers the first chemical selected from the group consisting of dichlorosilane (DCS); hexachlorodisilane (HCD); Bis(TertiaryButylAmino)silane (BTBAS); and trimethylaluminium (TMA).

11. The semiconductor fabrication apparatus of claim 1, wherein the second chemical delivery mechanism is connected to a second chemical source that delivers the second chemical selected from the group consisting of ammonia ($NH_3$), argon, nitrogen ($N_2$), hydrogen ($H_2$), helium (He), carbon dioxide ($CO_2$), oxygen ($O_2$), ozone ($O_3$), water ($H_2O$), hydrogen peroxide ($H_2O_2$), and boron precursor.

12. The semiconductor fabrication apparatus of claim 1, further comprising a pre-reaction edge chemical injector configured designed to provide the second chemical to a pre-reaction zone on one side of the second reaction zone.

13. The semiconductor fabrication apparatus of claim 12, further comprising a post-reaction edge chemical injector configured designed to provide the second chemical to a post-reaction zone on another side of the second reaction zone.

14. The semiconductor fabrication apparatus of claim 13, further comprising a first exhaust mechanism configured to provide a first purge zone between the pre-reaction zone and the second reaction zone.

15. The semiconductor fabrication apparatus of claim 14, further comprising a second exhaust mechanism configured to provide a second purge zone between the post-reaction zone and the second reaction zone.

16. The semiconductor fabrication apparatus of claim 1, further comprising an exhaust mechanism configured at an edge of the first reaction zone, wherein the first chemical delivery mechanism includes a chemical spray head configured to deliver the first chemical in a direction perpendicular to the substrate stage.

17. The semiconductor fabrication apparatus of claim 1, wherein
the first radial chemical injector is configured with its length oriented from an edge of the processing chamber to the axis; and
the edge chemical injector is configured at the edge of the processing chamber and is oriented with its length extended from one side of the second reaction zone to another side of the second reaction zone.

18. A semiconductor fabrication system, comprising:
a load lock module to load and unload plurality of wafers;
a transfer module integrated with the load lock module; and
a plurality of spatial atomic layer deposition (SALD) modules integrated with the transfer modules, wherein each SALD module includes
a processing chamber;
a wafer stage configured in the processing chamber, the wafer stage is operable to secure and rotate the plurality of wafers around an axis;
a first chemical delivery mechanism configured in the processing chamber to provide a first chemical to a first reaction zone in the processing chamber; and
a second chemical delivery mechanism configured in the processing chamber to provide a second chemical to a second reaction zone in the processing chamber, wherein the second chemical delivery mechanism includes an edge chemical injector and a first radial chemical injector both configured to deliver the second chemical to the second reaction zone.

19. The semiconductor fabrication apparatus of claim 18, wherein
the edge chemical injector is configured at an edge of the processing chamber; and
the first radial chemical injector is configured with its length oriented from the edge of the processing chamber to the axis.

20. A method, comprising:
loading a plurality of wafers to a spatial atomic layer deposition (SALD) module;
performing a deposition process to the plurality of wafers in the SALD module; and
thereafter, unloading the plurality wafers from the SALD module, wherein the SALD module includes
a processing chamber;
a wafer stage configured in the processing chamber, the wafer stage is operable to secure and rotate the plurality of wafers around an axis;
a first chemical delivery mechanism configured in the processing chamber to provide a first chemical to a first reaction zone in the processing chamber; and
a second chemical delivery mechanism configured in the processing chamber to provide a second chemical to a second reaction zone in the processing chamber, wherein the second chemical delivery mechanism includes an edge chemical injector and a first radial chemical injector both configured to deliver the second chemical to the second reaction zone.

* * * * *